(12) United States Patent
Uesugi

(10) Patent No.: US 8,409,983 B2
(45) Date of Patent: Apr. 2, 2013

(54) CHEMICAL VAPOR DEPOSITION APPARATUS, FILM FORMING METHOD, AND METHOD OF MANUFACTURING SEMICONDUCTOR DEVICE

(75) Inventor: Hiroyuki Uesugi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 917 days.

(21) Appl. No.: 12/510,608

(22) Filed: Jul. 28, 2009

(65) Prior Publication Data

US 2009/0286398 A1 Nov. 19, 2009

Related U.S. Application Data

(63) Continuation of application No. PCT/JP2007/055287, filed on Mar. 15, 2007.

(51) Int. Cl.
*H01L 21/44* (2006.01)

(52) U.S. Cl. .. 438/643; 438/653; 438/681; 257/E21.584

(58) Field of Classification Search .................. 438/686, 438/643, 652, 653, 680, 681; 257/E21.584
See application file for complete search history.

(56) References Cited

U.S. PATENT DOCUMENTS

| | | | |
|---|---|---|---|
| 5,139,825 A * | 8/1992 | Gordon et al. | 427/255.394 |
| 5,763,007 A * | 6/1998 | Weiller | 427/248.1 |
| 5,789,024 A * | 8/1998 | Levy et al. | 427/244 |
| 6,365,495 B2 | 4/2002 | Wang et al. | |
| 6,471,781 B1 * | 10/2002 | Tobe et al. | 118/726 |
| 6,942,892 B1 * | 9/2005 | Ishibashi | 427/237 |
| 6,946,158 B2 | 9/2005 | Jahl et al. | |
| 7,214,618 B2 * | 5/2007 | Li et al. | 438/680 |
| 2003/0072883 A1 | 4/2003 | Jahl et al. | |
| 2004/0134429 A1 | 7/2004 | Yamanaka et al. | |
| 2006/0128108 A1 | 6/2006 | Kim et al. | |

FOREIGN PATENT DOCUMENTS

EP 1091018 A1 4/2001

(Continued)

OTHER PUBLICATIONS

International Search Report of PCT/JP2007/055287, date of mailing Apr. 24, 2007.

(Continued)

*Primary Examiner* — Michael Trinh
(74) *Attorney, Agent, or Firm* — Westerman, Hattori, Daniels & Adrian, LLP

(57) ABSTRACT

In forming a TiN film on a base material (10) by a MOCVD method, a space between a showerhead (3) and a trapping member (5) is heated by a heater (2) up to a temperature at which TDMAT is thermally decomposed, or higher. Next, source gas containing TDMAT, and so on are emitted from the showerhead (3) into a chamber (1). As a result, the TDMAT emitted into the chamber (1) is thermally decomposed into TiN, carbon, and hydrocarbon by the heater (2) in the space between the showerhead (3) and the trapping member (5). Then, the TiN, carbon, and hydrocarbon move toward the base material (10). Then, the carbon and hydrocarbon are trapped by the trapping member (5). On the other hand, the TiN passes through the trapping member (5) without being trapped to reach the base material (10). As a result, a TiN film containing neither carbon nor hydrocarbon grows on a surface of the base material (10).

13 Claims, 4 Drawing Sheets

FOREIGN PATENT DOCUMENTS

| | | |
|---|---|---|
| JP | 2000-277501 A | 10/2000 |
| JP | 2000-286215 A | 10/2000 |
| JP | 2001-240969 A | 9/2001 |
| JP | 2001-326192 A | 11/2001 |
| JP | 2003-41365 A | 2/2003 |
| JP | 2006-161163 A | 6/2006 |
| WO | 00/44033 A1 | 7/2000 |

OTHER PUBLICATIONS

Notification of Transmittal of Translation of the International Preliminary Report on Patentability (Form PCT/IB/338) of International Application No. PCT/JP2007/055287 mailed Oct. 8, 2009 with Forms PCT/IB/373 and PCT/ISA/237.

* cited by examiner

CHEMICAL VAPOR DEPOSITION APPARATUS, FILM FORMING METHOD, AND METHOD OF MANUFACTURING SEMICONDUCTOR DEVICE

CROSS REFERENCE TO RELATED APPLICATIONS

This application is a Continuation of International Application No. PCT/JP2007/055287, with an international filing date of Mar. 15, 2007, which designating the United States of America, the entire contents of which are incorporated herein by reference.

TECHNICAL FIELD

The present invention relates to a chemical vapor deposition apparatus, a film forming method, and a method of manufacturing a semiconductor device which are suitable for forming a barrier metal film.

BACKGROUND ART

In forming wiring included in a semiconductor device, a barrier metal film such as a TiN film and a Ti film is formed. Examples of a method of forming the TiN film are a sputtering method, a MOCVD (Metal Organic Chemical Vapor Deposition) method, and the like. The MOCVD method has an advantage of high coverage.

In forming the TiN film by the MOCVD method, tetrakis (dimethylamino)titanium (TDMAT: $Ti[N(CH_3)_2]_4$) is mainly used a raw material. TDMAT is especially effective when used after the formation of Al wiring because it is thermally decomposed at relatively low temperatures.

However, since TDMAT contains carbon, carbon and hydrocarbon are easily taken into the TiN film. The TiN film, when carbon or hydrocarbon is taken thereto, increases in specific resistance and thus cannot exhibit a desired characteristic.

Therefore, the conventional method has a process of removing carbon and hydrocarbon by irradiating a TiN film with plasma after forming the TiN film with a thickness of about 10 nm or less. A reason why the thickness of the TiN film is set to about 10 nm or less is that even the plasma irradiation cannot completely remove carbon and so on if the TiN film has a larger thickness than this. Incidentally, RF power for the plasma irradiation is about 750 W.

In this method, however, the number of processes increases as the thickness that the TiN film is required to have is larger. For example, when a TiN film with 20 nm is necessary, it is necessary to repeat the formation of the TiN film at least twice and the plasma irradiation at least twice. As an extreme example, when a TiN film with 100 nm is necessary, it is necessary to repeat the formation of the TiN film at least ten times and the plasma irradiation at least ten times. Therefore, it cannot be said that a throughput is sufficiently high. Further, as the number of times of the plasma irradiation increases, semiconductor elements such as transistors already formed are more damaged.

Increasing the RF power of the plasma irradiation enables a high throughput, but accordingly gives a greater damage to the semiconductor elements. Conversely, decreasing the RF power enables a reduction in the damage to the semiconductor elements, but accordingly lowers the throughput.

Patent document 1: Japanese Laid-open Patent Publication No. 2006-161163

Patent document 2: Japanese Laid-open Patent Publication No. 2001-326192

Patent document 3: Japanese Laid-open Patent Publication No. 2000-286215

SUMMARY OF THE INVENTION

It is an object of the present invention to provide a chemical vapor deposition apparatus, a film forming method, and a method of manufacturing a semiconductor device which are capable of reducing the mixture of carbon and hydrocarbon into a TiN film in a MOCVD method.

The inventor of the present application has reached the following various aspects of the invention after repeated studious studies with the intention of solving the aforesaid problems.

A chemical vapor deposition apparatus according to the present invention includes: a chamber; a susceptor provided in the chamber; and a supplier supplying source gas containing organic metal into the chamber. The chemical vapor deposition apparatus further includes: a heater heating the organic metal supplied by the supplier to decompose the organic metal; and a trapper trapping carbon and hydrocarbon produced by decomposition of the organic metal before the organic metal reaches the susceptor.

In a method of manufacturing a semiconductor device according to the present invention, a base material is placed on the susceptor of the chemical vapor deposition apparatus described above, and thereafter, a film is grown on the base material by chemical vapor deposition.

DETAILED DESCRIPTION OF THE PREFERRED EMBODIMENTS

Figure 1:
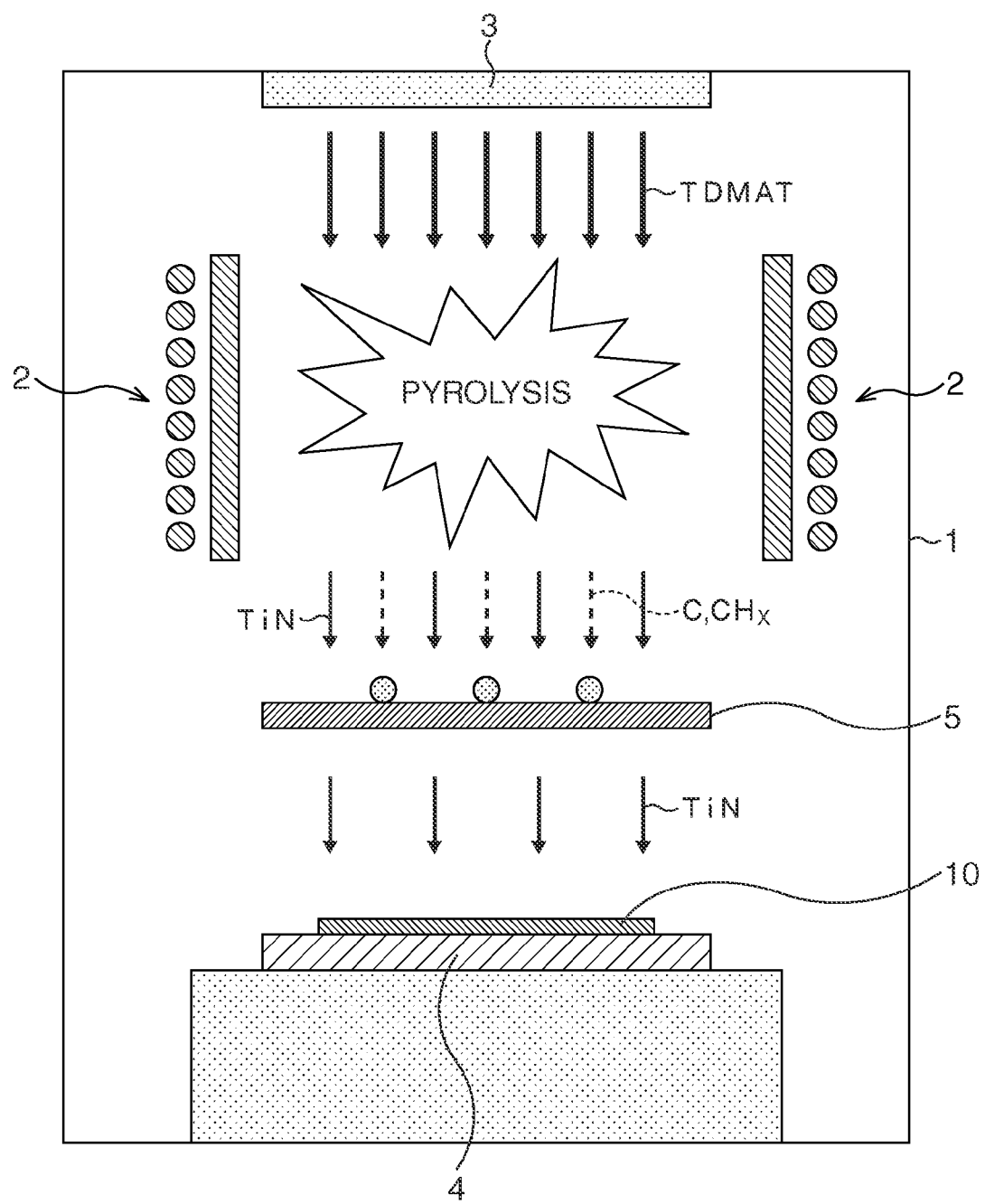
FIG. 1 is a schematic view depicting a structure of a chemical vapor deposition apparatus according to an embodiment of the present invention.

Hereinafter, an embodiment of the present invention will be concretely described with reference to the attached drawings. FIG. 1 is a schematic view depicting a structure of a chemical vapor deposition apparatus (CVD apparatus) according to an embodiment of the present invention.

In this embodiment, as depicted in FIG. 1, a showerhead 3 emitting source gas containing organic metal is provided in an upper part of a chamber 1. Examples of the organic metal are tetrakis (dimethylamino)titanium (TDMAT: $Ti[N(CH_3)_2]_4$) and tetrakis (diethylamino)titanium (TDEAT: $Ti[N(C_2H_5)_2]_4$), but the organic metal is not limited to these. Further, carrier gas such as nitrogen gas, helium gas, and argon gas may be emitted from the showerhead 3. Further, the source gas may contain ammonia for supplying nitrogen atoms.

Further, a stage (susceptor) 4 on which a base material 10 such as a semiconductor substrate is placed is provided in a lower part of the chamber 1. As the base material 10, used is, for example, a silicon substrate, a compound semiconductor substrate, and any of these substrates having an insulating film and/or an insulating film and so on formed thereon. Further, between the showerhead 3 and the stage 4, a trapping member 5 trapping carbon atoms and hydrocarbon molecules is installed. The trapping member 5 contains, for example, a Pt group element such as Pt, Ru, Rh, Pd, OS, and Ir. Further, a heater 2 heating a space between the showerhead 3 and the trapping member 5 is provided in the chamber 1.

Next, a description will be given of a method of forming a TiN film on the base material 10 by a MOCVD method with using the CVD apparatus as structured above.

First, the base material 10 is placed on the stage 4. Next, the space between the showerhead 3 and the trapping member 5 is heated by the heater 2 to a temperature at which TDMAT is thermally decomposed (about 150° C.), or higher. Next, the source gas containing TDMAT and the carrier gas are emitted from the showerhead 3 into the chamber 1. As a result, TDMAT emitted into the chamber 1 is thermally decomposed by the heater 2 into TiN, carbon (C), and hydrocarbon ($CH_x$) in the space between the showerhead 3 and the trapping member 5. Then, the TiN, carbon, and hydrocarbon move toward the base material 10. Here, the trapping member 5 is installed in a movement route to the base material 10. Therefore, the carbon and hydrocarbon are trapped by the trapping member 5. On the other hand, the TiN passes through the trapping member 5 without being trapped to reach the base material 10. As a result, a TiN film containing neither carbon nor hydrocarbon grows on a surface of the base material 10.

As described above, according to the present embodiment, it is possible to grow, on the base material 10, the TiN film containing neither carbon nor hydrocarbon. This eliminates a need for plasma processing for removing the carbon and hydrocarbon from the TiN film after the formation of the TiN film. Therefore, even when the TiN film needs to have a large thickness, there is no need to grow the TiN film in a plurality of divided processes. This greatly reduces the necessary number of processes and process time, enabling an improvement in throughput. Further, it is possible to prevent damages to semiconductor elements and the like accompanying the plasma processing. Further, no facility for the plasma processing is necessary, which simplifies the whole structure of the CVD apparatus.

Incidentally, in forming the TiN film, it is preferable to make the source gas contain a substance containing nitrogen atoms, such as ammonia. This is because, when the source gas contains no substance containing nitrogen atoms besides TDMAT or the like, a Ti film may be formed due to lack of nitrogen atoms or a TiN film containing excessive Ti may be formed. Conversely, in order to form a Ti film, source gas containing only TDMAT may be used.

Further, for forming the TiN film or the Ti film, the base material 10 need not be heated. A conventional CVD apparatus does not include what corresponds to the heater 2, and thus, on the surface of the base material 10, TDMAT and so on need to be thermally decomposed by heating the base material 10 up to an about 400° C. temperature, but in the present embodiment, the thermal decomposition on the surface of the base material 10 is not necessary. Conventionally, heating a base material including Al wiring up to a temperature higher than 400° C. has been avoided, which limits the kinds of usable organic metal. In the present embodiment, on the other hand, since the organic metal is thermally decomposed by the heating by the heater 2, there is no need to heat the base material, and organic metal thermally decomposed at high temperatures is also usable.

The temperature of the space between the showerhead 3 and the trapping member 5 may be any provided that it is a temperature at which organic metal such as TDMAT is thermally decomposed, or higher, and too high a temperature only results in a greater load to the heater 2. Therefore, the temperature of this space is preferably about 150° C. to 800° C.

Next, a description will be given of a method of manufacturing a semiconductor device with using the CVD apparatus described above. FIG. 2A to FIG. 2G are cross-sectional views depicting the method of manufacturing a semiconductor device in order of processes.

Figure 2A:
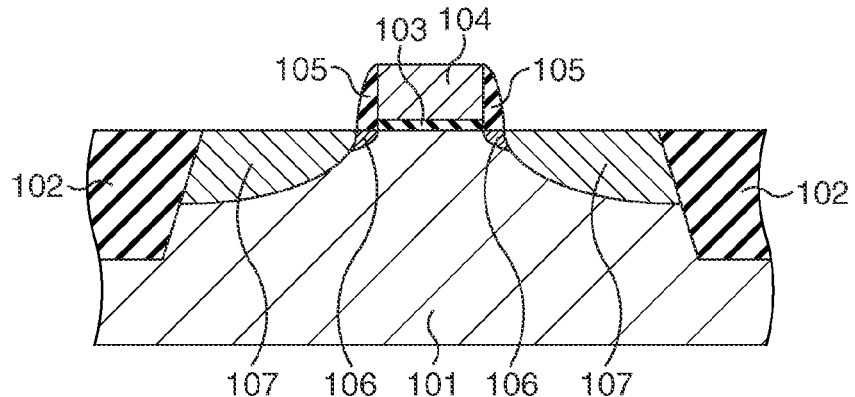
FIG. 2A is a cross-sectional view depicting a method of manufacturing a semiconductor device.

First, as depicted in FIG. 2A, an element isolation insulating film 102 is formed on a surface of a semiconductor substrate 101 by a STI (shallow trench isolation) method. Incidentally, the element isolation insulating film 102 may be formed by a LOCOS (local oxidation of silicon) method or the like. Next, in an element region defined by the element isolation insulating film 102, a field-effect transistor is formed. In forming the field-effect transistor, a gate insulating film 103 and a gate electrode 104 are first formed. Next, low-concentration impurity diffused layers 106, a sidewall insulating film 105, and high-concentration impurity diffused layers 107 are sequentially formed.

Figure 2B:
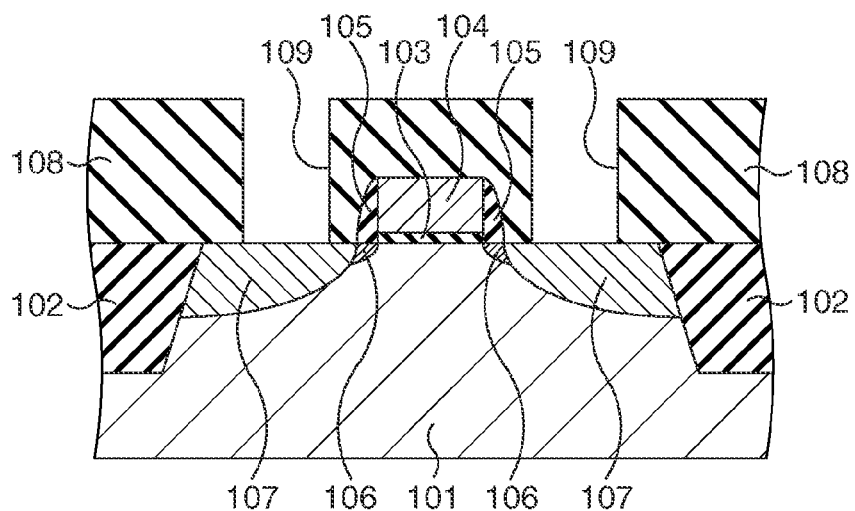
FIG. 2B, which continues from FIG. 2A, is a cross-sectional view depicting the method of manufacturing the semiconductor device.

Thereafter, as depicted in FIG. 2B, an interlayer insulating film 108 covering the field effect transistor is formed. Subsequently, contact holes 109 reaching the high-concentration impurity diffused layers 107 are formed in the interlayer insulating film 108.

Figure 2C:
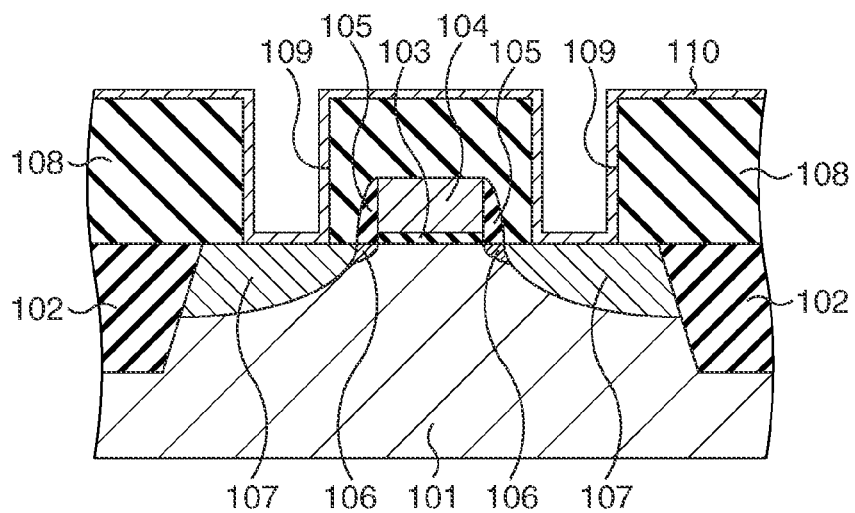
FIG. 2C, which continues from FIG. 2B, is a cross-sectional view depicting the method of manufacturing the semiconductor device.

Next, as depicted in FIG. 2C, with using the CVD apparatus depicted in FIG. 1, a TiN film 110 as a barrier metal film is formed on bottom surfaces and side surfaces of the contact holes 109 and on a surface of the interlayer insulating film 108 by a MOCVD method. Incidentally, a Ti film may be formed before the formation of the TiN film 110 so that the barrier metal film may have two-layer structure.

Figure 2D:
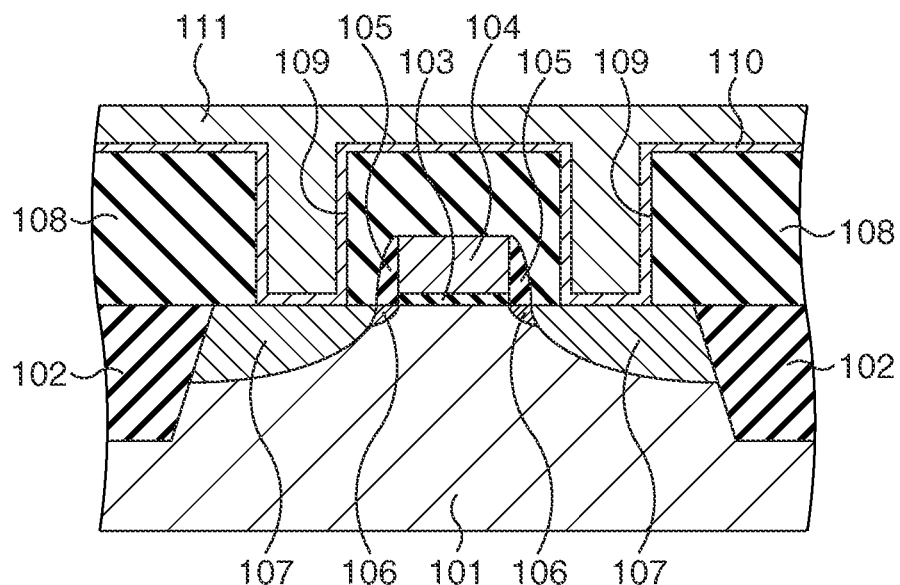
FIG. 2D, which continues from FIG. 2C, is a cross-sectional view depicting the method of manufacturing the semiconductor device.

Next, as depicted in FIG. 2D, a W film 111 filling the contact holes 109 are formed on the TiN film 110. In forming the W film 111, the CVD apparatus depicted in FIG. 1 may be used.

Figure 2E:
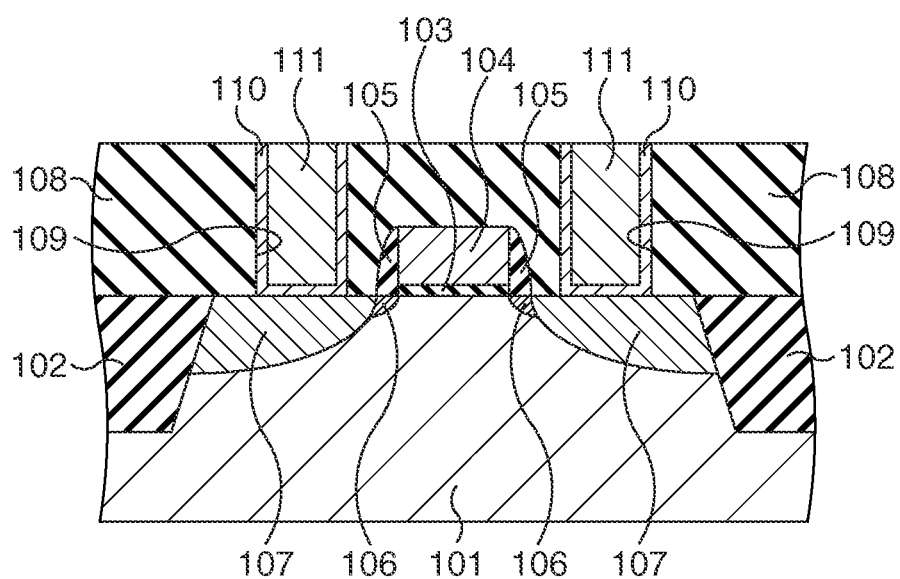
FIG. 2E, which continues from FIG. 2D, is a cross-sectional view depicting the method of manufacturing the semiconductor device.

Thereafter, as depicted in FIG. 2E, the W film 111 and the TiN film 110 are polished by a CMP (chemical mechanical polishing) method or the like until the surface of the interlayer insulating film 108 is exposed. As a result, contact plugs including the TiN film 110 and the W film 111 are left in the contact holes 109.

Figure 2F:
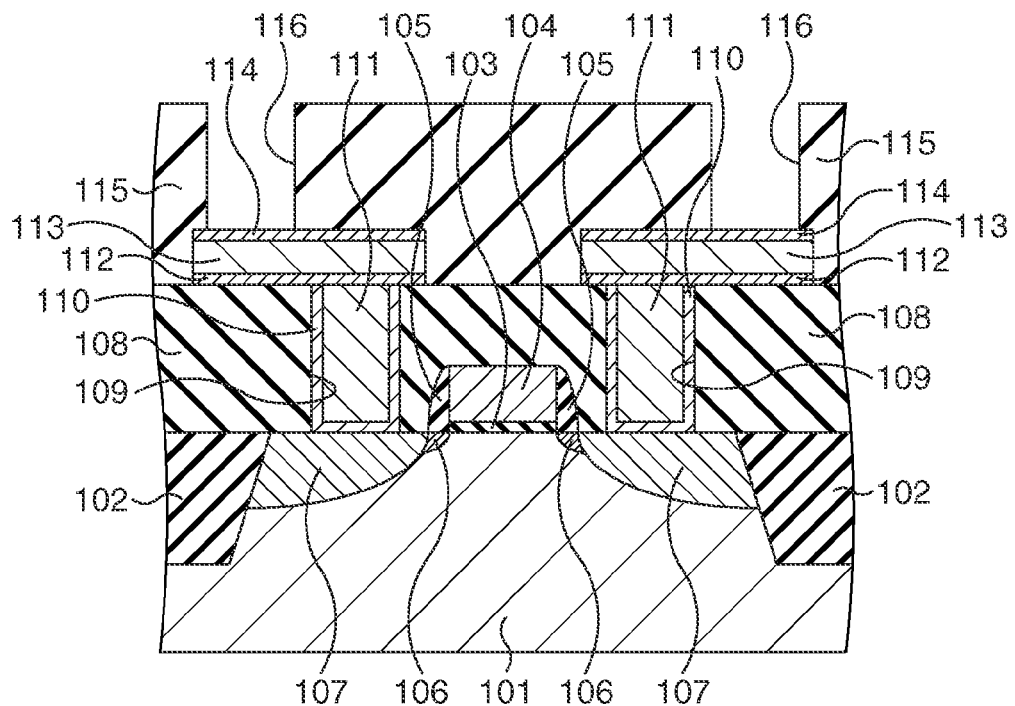
FIG. 2F, which continues from FIG. 2E, is a cross-sectional view depicting the method of manufacturing the semiconductor device.
Figure 2G:
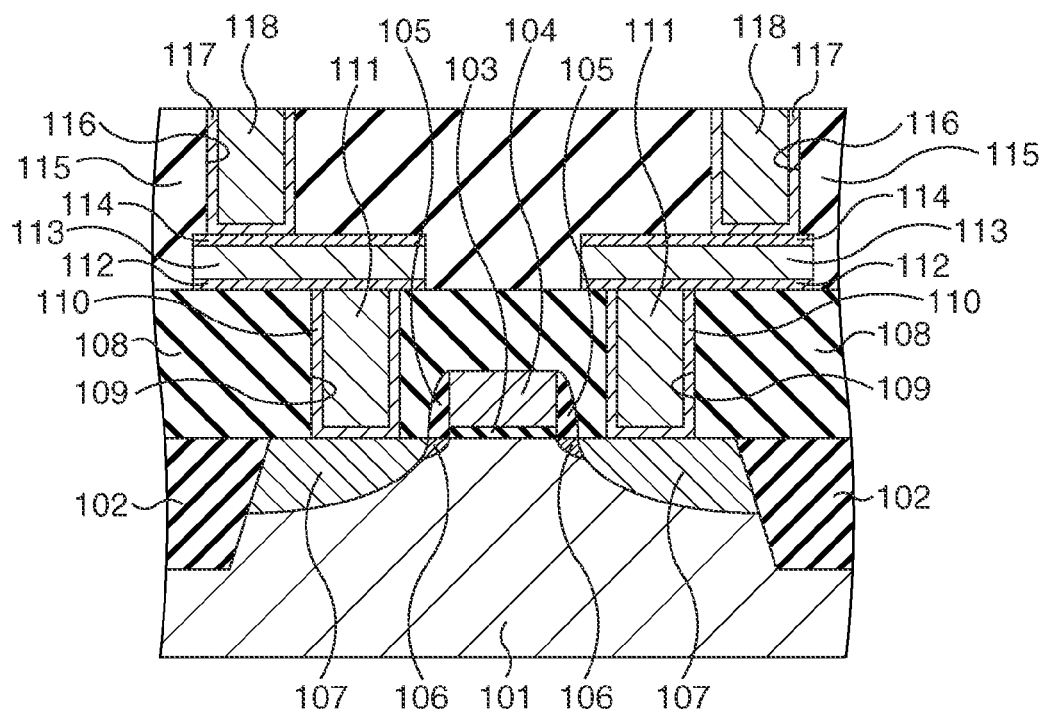
FIG. 2G, which continues from FIG. 2F, is a cross-sectional view depicting the method of manufacturing the semiconductor device.

Subsequently, as depicted in FIG. 2F, wirings connected to the contact plugs are formed. In forming the wirings, a TiN film 112 is formed with using the CVD apparatus depicted in FIG. 1, an Al film 113 is formed, and a TiN film 114 is formed with using the CVD apparatus depicted in FIG. 1, and these films are patterned. Incidentally, between the formation of the Al film 113 and the formation of the TiN film 114, a Ti film may be formed with using the CVD apparatus depicted in FIG. 1. Further, in forming the Al film 113, the CVD apparatus depicted in FIG. 1 may be used.

As depicted in FIG. 2F, after the formation of the wirings, an interlayer insulating film 115 covering the wirings is formed. Next, via holes 116 reaching the wirings are formed in the interlayer insulating film 115.

Next, in the same manner as the manner of forming the contact plugs including the TiN film 110 and the W film 111, via plugs including the TiN film 117 and the W film 118 are formed in the via holes 116.

Thereafter, upper wirings and so on are formed, whereby the semiconductor device is completed.

It should be noted that, though only TDMAT or TDEAT is named as the organic metal in the above description, other organic metal may be used. Further, the film to be formed is not limited to the TiN film or the Ti film.

Further, the application of the present invention is not limited to formation of a barrier metal film, and the present invention is also applicable to, for example, formation of a TiN film as a hard mask, formation of a TiN film or a Ti film as the whole or a part of an electrode, and the like.

Industrial Applicability

According to the present invention, since the organic metal is decomposed before reaching the susceptor and the carbon and hydrocarbon produced by the decomposition are trapped by the trapper, it is possible to prevent the carbon and hydrocarbon from mixing into the film formed on the base material. This can eliminate a need for plasma processing and the like for removing the carbon and hydrocarbon. Further, since the base material itself need not be heated, organic metal decomposed at relatively high temperatures is usable.

What is claimed is:

1. A film forming method comprising:
    placing a base material on a susceptor of a chemical vapor deposition apparatus, the chemical vapor deposition apparatus comprising:
        a chamber;
        the susceptor provided in the chamber;
        a supplier supplying source gas containing organic metal into the chamber;
        a heater heating the organic metal supplied by the supplier to decompose the organic metal; and
        a trapper trapping carbon and hydrocarbon produced by decomposition of the organic metal before the organic metal reaches the susceptor; and
    growing a film on the base material by chemical vapor deposition.

2. The film forming method according to claim 1, wherein a trapper containing a platinum group element is used as the trapper.

3. The film forming method according to claim 1, wherein a trapper containing at least one kind of element selected from a group consisting of platinum (Pt), ruthenium (Ru), rhodium (Rh), palladium (Pd), osmium (Os), and iridium (Ir) is used as the trapper.

4. The film forming method according to claim 1, wherein organic metal containing titanium (Ti) and nitrogen (N) is used as the organic metal.

5. The film forming method according to claim 4, wherein a trapper allowing passage of titanium (Ti) and nitrogen (N) is used as the trapper.

6. A method of manufacturing a semiconductor device, the method comprising:
    placing a base material on a susceptor of a chemical vapor deposition apparatus, the chemical vapor deposition apparatus comprising:
        a chamber;
        the susceptor provided in the chamber;
        a supplier supplying source gas containing organic metal into the chamber;
        a heater heating the organic metal supplied by the supplier to decompose the organic metal; and
        a trapper trapping carbon and hydrocarbon produced by decomposition of the organic metal before the organic metal reaches the susceptor; and
    growing a film on the base material by chemical vapor deposition.

7. The method of manufacturing the semiconductor device according to claim 6, wherein a trapper containing a platinum group element is used as the trapper.

8. The method of manufacturing the semiconductor device according to claim 6, wherein a trapper containing at least one kind of element selected from a group consisting of platinum (Pt), ruthenium (Ru), rhodium (Rh), palladium (Pd), osmium (Os), and iridium (Ir) is used as the trapper.

9. The method of manufacturing the semiconductor device according to claim 6, wherein organic metal containing titanium (Ti) and nitrogen (N) is used as the organic metal.

10. The method of manufacturing the semiconductor device according to claim 9, wherein a trapper allowing passage of titanium (Ti) and nitrogen (N) is used as the trapper.

11. The method of manufacturing the semiconductor device according to claim 6, wherein the film is formed as a barrier metal film.

12. The method of manufacturing the semiconductor device according to claim 6, wherein the film is formed as a hard mask.

13. The method of manufacturing the semiconductor device according to claim 6, wherein the film is formed as at least a part of an electrode.

\* \* \* \* \*